(12) United States Patent
Lee et al.

(10) Patent No.: US 6,621,096 B2
(45) Date of Patent: Sep. 16, 2003

(54) DEVICE ISOLATION PROCESS FLOW FOR ARS SYSTEM

(75) Inventors: Heon Lee, Sunnyvale, CA (US); Chung-Ching Yang, Saratoga, CA (US); Peter Hartwell, Sunnyvale, CA (US)

(73) Assignee: Hewlett-Packard Develpoment Company, L.P., Houston, TX (US)

( * ) Notice: Subject to any disclaimer, the term of this patent is extended or adjusted under 35 U.S.C. 154(b) by 15 days.

(21) Appl. No.: 09/860,524

(22) Filed: May 21, 2001

(65) Prior Publication Data

US 2002/0173153 A1 Nov. 21, 2002

(51) Int. Cl.[7] .............................................. H01L 29/06
(52) U.S. Cl. .......................... 257/10; 257/10; 257/13; 257/16; 257/22
(58) Field of Search ........................... 257/10, 13, 16, 257/22; 369/101

(56) References Cited

U.S. PATENT DOCUMENTS

| | | | | |
|---|---|---|---|---|
| 5,378,182 A | * | 1/1995 | Liu | 445/24 |
| 5,436,495 A | | 7/1995 | Sakamoto | 257/506 |
| 5,557,596 A | * | 9/1996 | Gibson et al. | 369/101 |
| 5,844,250 A | * | 12/1998 | Itoh et al. | 257/10 |
| 6,124,622 A | | 9/2000 | Tsutsumi | 257/506 |
| 6,171,930 B1 | | 1/2001 | Lee et al. | 438/432 |
| 6,175,122 B1 | * | 1/2001 | Groves et al. | 250/492.23 |
| 6,249,080 B1 | * | 6/2001 | Komoda et al. | 313/310 |
| 6,346,931 B1 | * | 2/2002 | Cathey et al. | 345/74.1 |

* cited by examiner

*Primary Examiner*—Benjamin L. Utech
*Assistant Examiner*—Binh X. Tran

(57) ABSTRACT

A device isolation process flow for an atomic resolution storage (ARS) system inserts device isolation into a process flow of the ARS system so that diodes may be electrically insulated from one another to improve signal to noise ratio. In addition, since most harsh processing is done prior to depositing a phase change layer, which stores data bits, process damage to the phase change layer may be minimized.

8 Claims, 7 Drawing Sheets

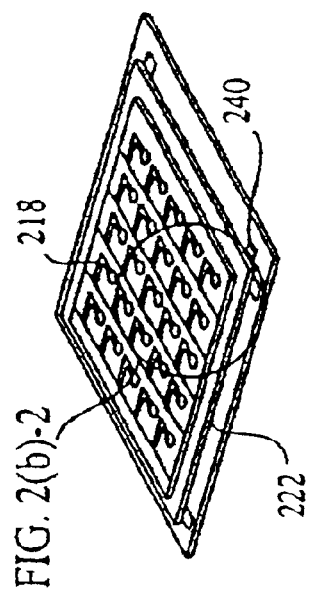
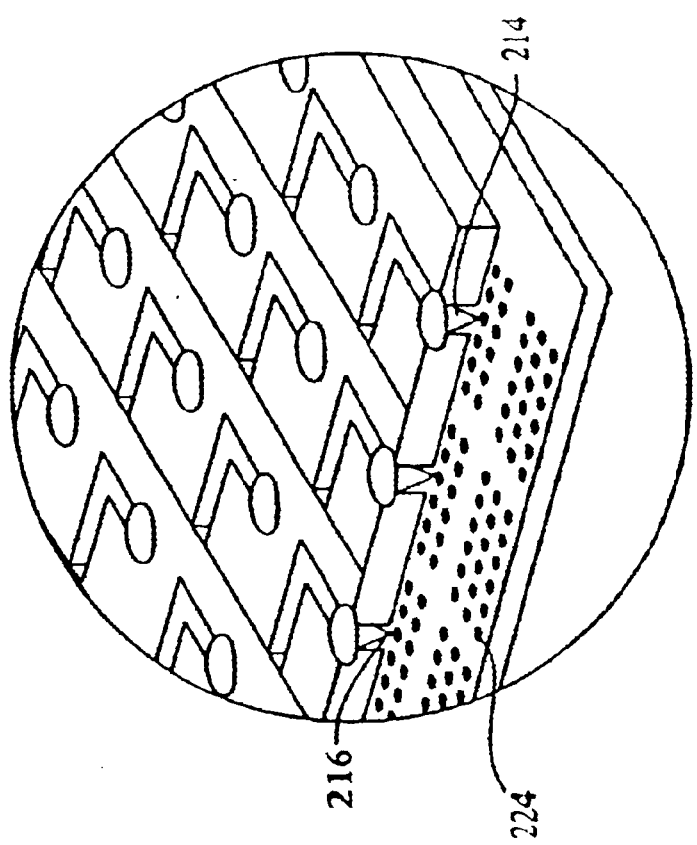

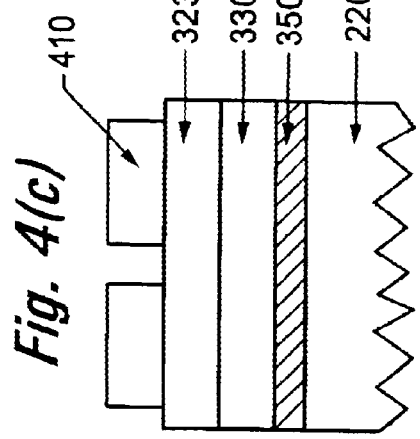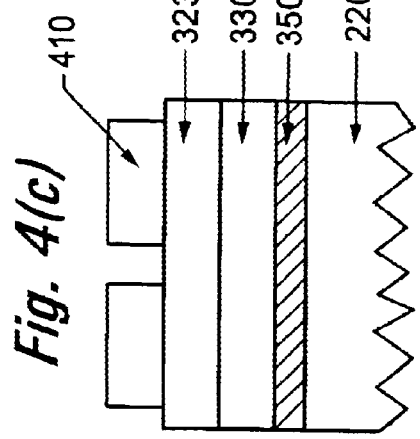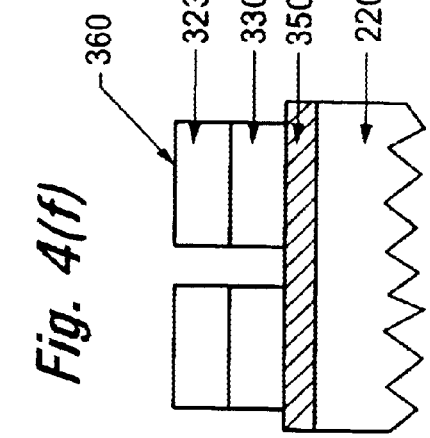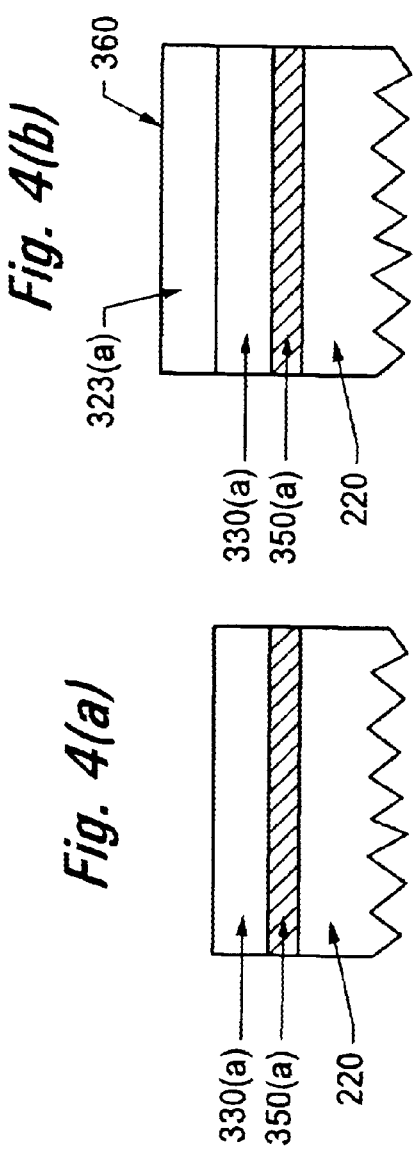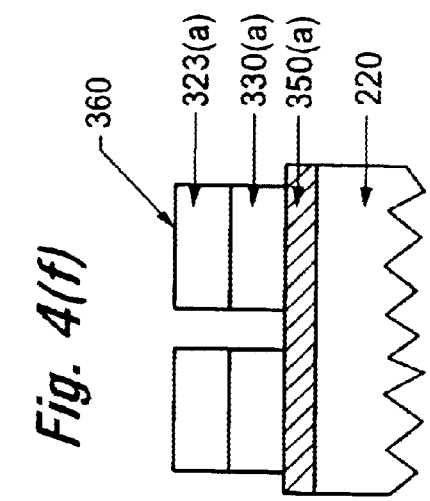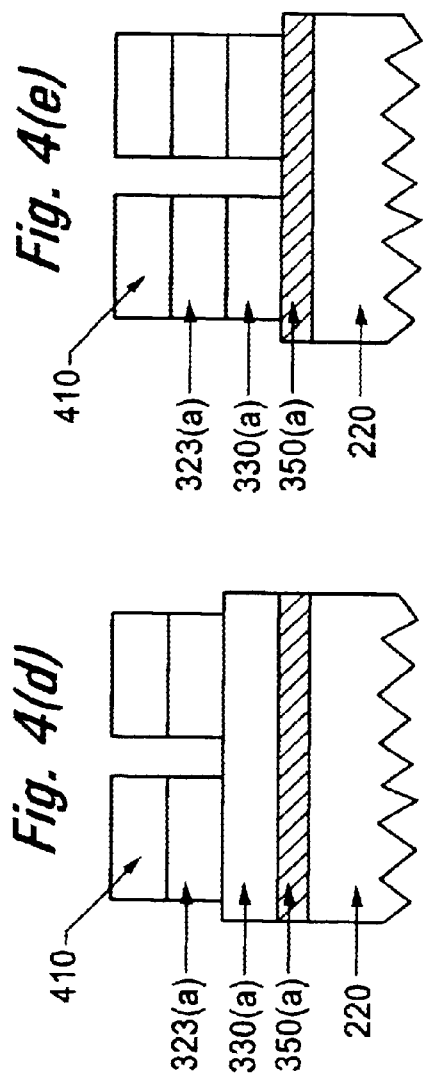

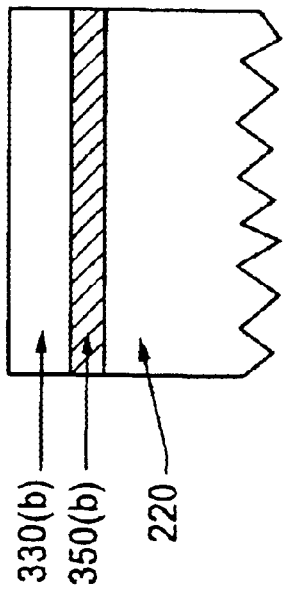
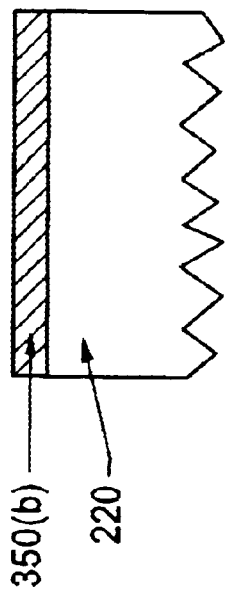
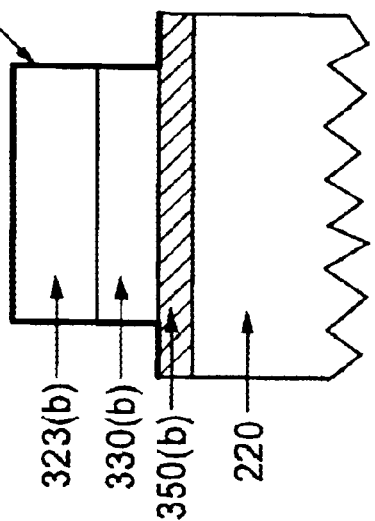

DEVICE ISOLATION PROCESS FLOW FOR ARS SYSTEM

TECHNICAL FIELD

The technical field relates to an atomic resolution storage (ARS) system, and, in particular, to device isolation process flow for the ARS system.

BACKGROUND

An ARS system provides a thumbnail-size device with storage densities greater than one terabit (1,000 gigabits) per square inch. The ARS technology builds on advances in atomic probe microscopy, in which a probe field emitter tip as small as a single atom scans the surface of a material to produce images accurate within a few nanometers. Probe storage technology may employ an array of atom-size probe field emitter tips to read and write data to spots on storage media.

An ARS system typically includes three bonded silicon (Si) wafers, i.e., a tip wafer, also known as an emitter wafer, a rotor wafer, also known as a mover wafer, and a stator wafer. The wafers are bonded together using wafer bonding techniques, which are well known in the art.

FIG. 1 illustrates a prior art ARS system, where all diodes share common electrodes. A tip wafer 110 includes a plurality of field emitter tips 114. A phase change layer 123, which may serve as a storage media to store data bits, is deposited on a substrate rotor wafer 120, also known as mover wafer. The substrate rotor wafer 120 is a highly doped Si substrate, which may be a n-type substrate or a p-type substrate. A capping layer 160 is coated over the phase change layer 123 to protect the phase change layer 123 and to prevent evaporation of material when heat is applied. The capping layer 160 also modifies the surface states of the phase change layer 123. Electron beam focusing electrodes 113 enables focused electron bean 116 to change the phase of media film locally. The rotor wafer 120 may move in x and y direction, as shown in FIG. 1, to allow data bits to be written to or read from the storage media.

The ARS storage media uses p-n junction diodes, i.e., devices embedded in a top active Si layer for reading the data bit. In the prior art ARS system, the diodes share common electrodes (not shown), which may increase cross talk between devices, leading to higher electrical noise.

SUMMARY

A method for device isolation for an ARS system includes forming an insulating layer between a wafer substrate, such as a rotor wafer, and a top active Si layer, forming a phase change layer over the top active Si layer, depositing, patterning, and selectively etching a masking layer over the phase change layer, and etching the top active Si layer using the masking layer as a mask until reaching the insulating layer. As a result, diodes, i.e., devices embedded in the top active Si layer, may become electrically isolated from one another to enhance signal to noise ratio for the ARS system.

In an embodiment of the device isolation process flow, the insulating layer is formed by ion implantation of oxygen beneath the top active Si layer on the wafer substrate and heating the oxygen to form oxide.

In another embodiment of the device isolation process flow, the insulating layer is formed by epitaxially growing Si with counter dopants over the rotor wafer substrate and heating the counter dopants.

The device isolation process flow inserts device isolation into a process flow of the ARS system so that the diodes may be electrically insulated from one another to improve signal to noise ratio. In addition, since most harsh processing are done prior to depositing the phase change layer, which stores data bits, process damage to the phase change layer may be minimized.

DESCRIPTION OF THE DRAWINGS

The preferred embodiments of the device isolation process flow will be described in detail with reference to the following figures, in which like numerals refer to like elements, and wherein:

FIGS. 2(a) and 2(b1 and 2) illustrate an exemplary ARS system;

FIGS. 4(a)–4(f) illustrate an exemplary device isolation process flow for the ARS system;

FIGS. 5(a)–5(c) illustrate another method for device isolation for the ARS system.

DETAILED DESCRIPTION

Figure 1:
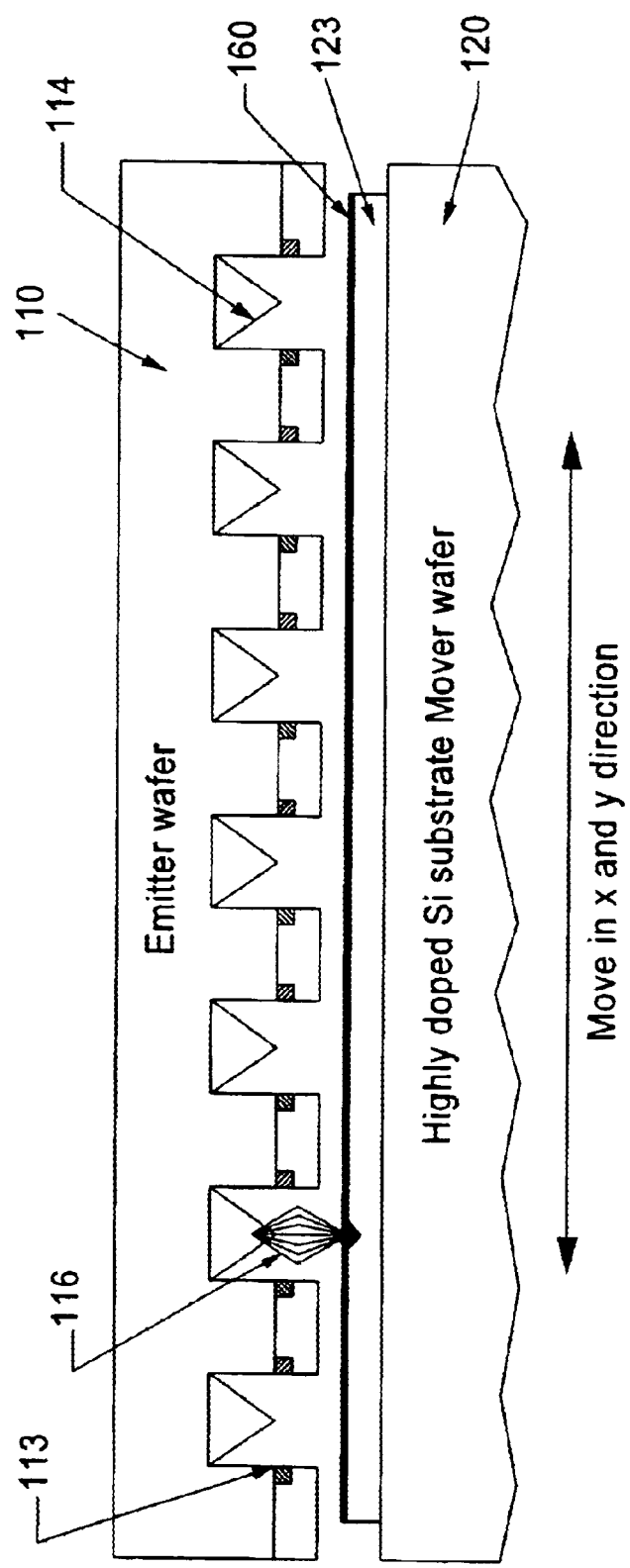
FIG. 1 illustrates a prior art ARS system with non-isolated devices.
Figure 2A:
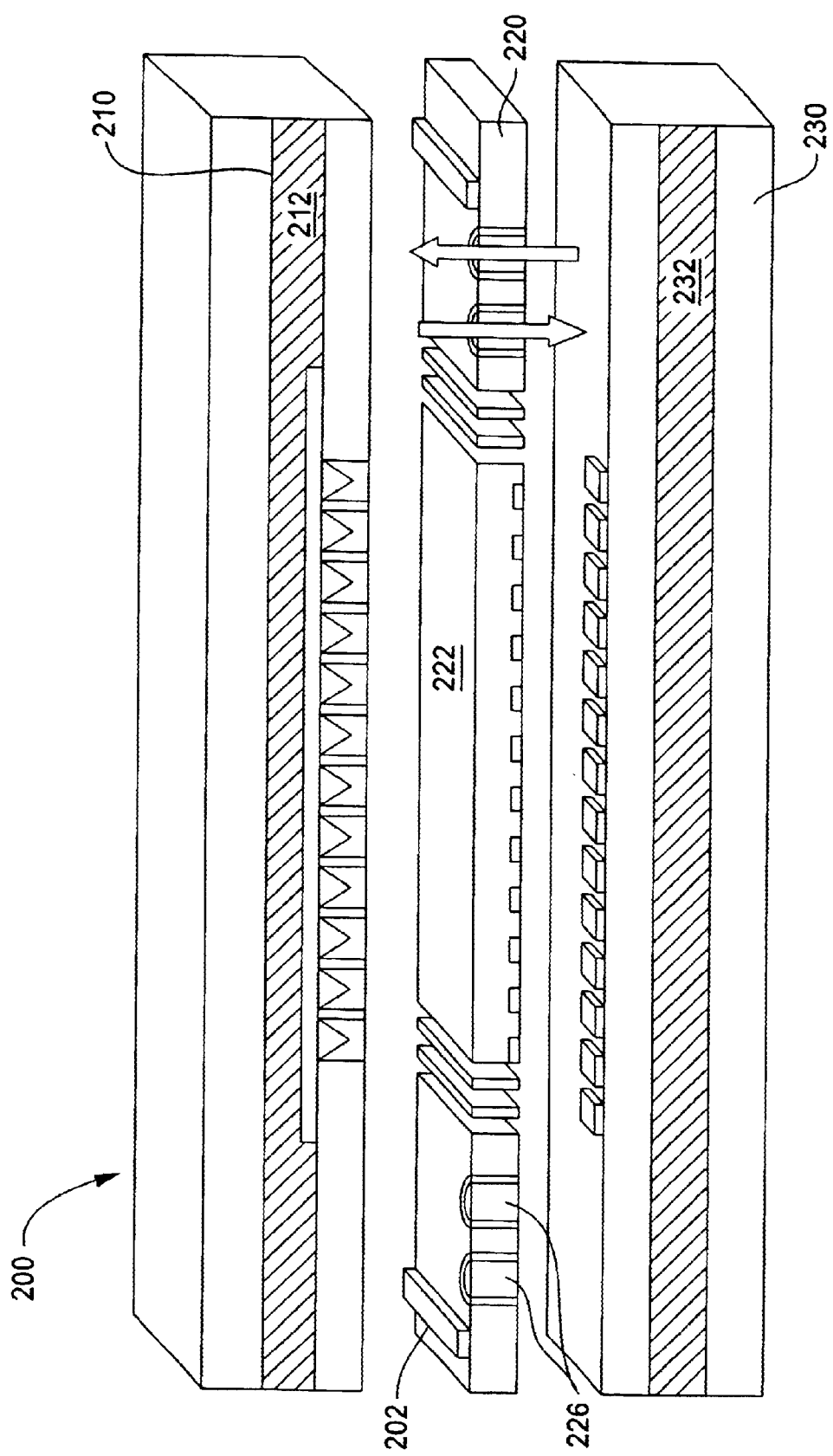

FIGS. 2(a) and 2(b) illustrate an exemplary ARS system 200. The ARS system 200 has high data storage capacity, up to 1000 Gb/in$^2$. The ARS system 200 is small, rugged, and portable. Additionally, the ARS system 200 has low power consumption, because there is typically no power consumption when the ARS system 200 is not being asked to perform an operation. Referring to FIG. 2(a), the ARS system 200 includes three bonded Si wafers, i.e., a tip wafer 210, also referred to as a first wafer in this specification, a rotor wafer 220, also known as a mover wafer and referred to as a second wafer in this specification, and a stator wafer 230. The rotor wafer 220, typically 100 microns thick, is a highly doped Si substrate, which may be a n-type substrate or a p-type substrate. The wafers 210, 220, 230 are bonded together, as shown in FIG. 2(a), using wafer bonding techniques, which are well known in the art.

Each wafer-to-wafer bond requires internal cavity be sealed at high vacuum using ultra-high vacuum (UHV) seals 202, which helps to maintain the internal environment of the ARS chip. The wafer-to-wafer bond also requires low resistance electrical contacts. For example, as shown in FIG. 2(a) conductive electrodes on a stator side of the rotor wafer 220 may be coupled with conductive electrodes on a rotor side of the stator wafer 230. Conductive electrodes on a media side of the rotor wafer 220 may be connected to complementary metal oxide semiconductor (CMOS) circuitry 232 located in the tip wafer 210. The tip electronics 212, which are located in the stator wafer 230, controls field emitter tips 214 (shown in FIG. 2(b)) that are required to interface with storage media 222 in the ARS system 200. The storage media 222, including medium recording cells 224 (shown in FIG. 2(b)), stores bits of data in the ARS system 200.

Read/write (R/W) electronics, which include the CMOS circuitry 232, are also located in the stator wafer 230 beneath the conductive electrodes 234(b). The R/W electronics may control reading or writing of data bits in the storage media 222.

Through-wafer vias 226 enable electrical R/W signals (not shown) to pass from the CMOS circuitry 232 in the stator wafer 230 to the conductive electrodes on the media side of the rotor wafer 220, as well as the tip electronics 212 in the tip wafer 210.

FIG. 2(b) illustrates the operation of the ARS system 200. A single field emitter tip 214 creates an electron beam 216 by drawing electrons off a metal in the field emitter tip 214 with a high electric field. The electron beam 216 is focused and used to write data bits onto the storage media 222 by heating tiny data spots and altering the data spots' physical state of phase. The electron bear 216 may also be used to determine the data bit state (value) in the storage media 222. The emitter tip array 218 is an array of field emitter tips 214, under which the storage media 222 is moved with nanometer precision. Suspension springs 240, shown in FIG. 2(b), may hold the rotor wafer 220 between the field emitter tips 214 and the stator wafer 231 to allow the data bits to be moved relative to the field emitter tips 214, thus allowing each field emitter tip 214 to access multiple data bits.

For the ARS system 200 to operate, the rotor wafer 220 and the stator wafer 230 need to be processed, i.e., depositing conductive electrodes, for the nanometer precise position controls. Examples of process flow for the ARS system 200 are described in United States Patent Applications of Lee, et al., entitled "Process Flow for ARS Mover Using Selenidation Wafer Bonding After Processing A Media Side OF A Rotor Wafer," and "Process Flow for ARS Mover Using Selenidation Wafer Bonding Before Processing A Media Side OF A Rotor Wafer," filed on the same day herewith, which are incorporated herein by reference.

A device isolation process flow inserts device isolation into the process flow of the ARS system 200 so that diodes, i.e., small electronic devices embedded in a phase change layer 323 (described later) and a top active Si layer 330 (described later) and positioned on the surface of the rotor wafer 220, may be electrically insulated from one another. As a result, signal to noise ratio may be improved. In addition, since most harsh processing is done prior to depositing the phase change layer, which stores data bits, process damage to the phase change layer may be minimized.

Figure 3:
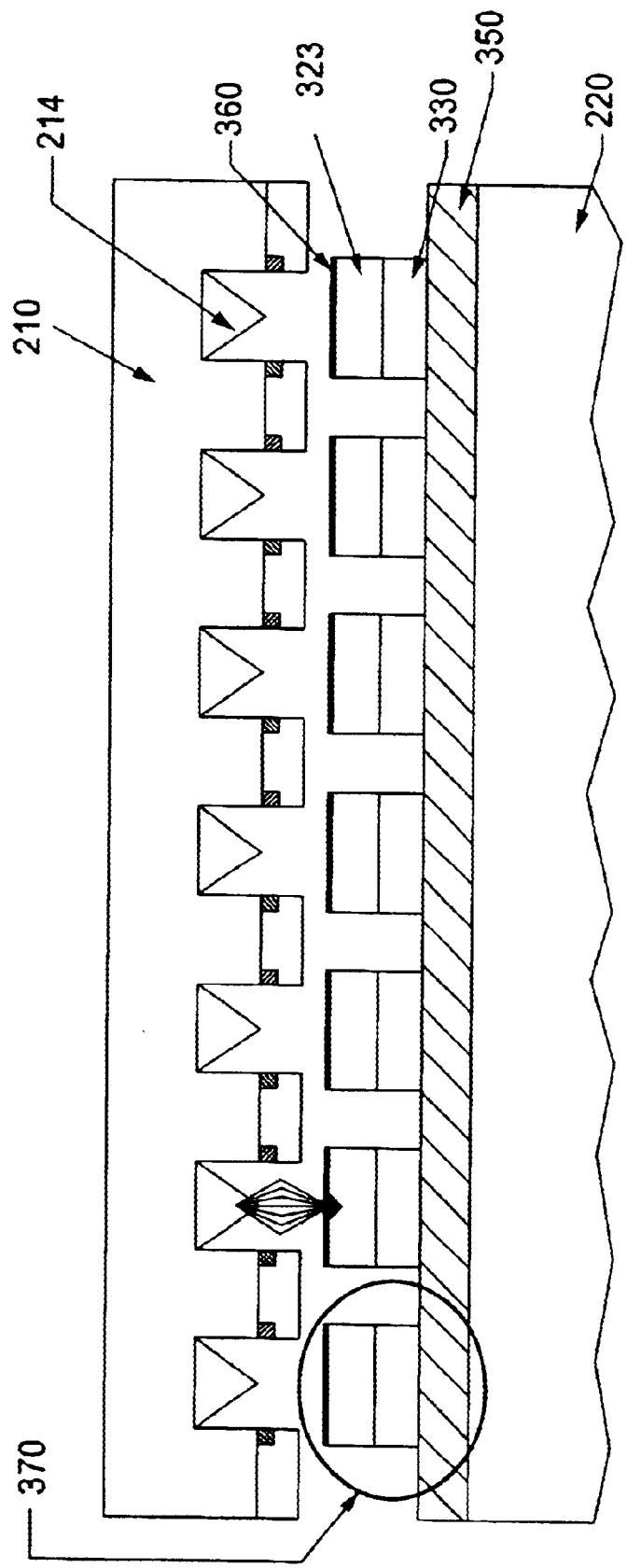
FIG. 3 illustrates the exemplary ARS system with isolated devices.

FIG. 3 illustrates an exemplary ARS system with isolated devices. A tip wafer 210, also referred to as an emitter wafer, may include a plurality of field emitter tips 214. The tip emitters 214 maybe replaced by flat emitters. An insulating layer 350, such as an embedded oxide layer 350(a) (described later) or a counter doped semi-insulating Si layer 350(b) (described later), may be formed beneath atop active Si layer 330 on the rotor wafer 220. A phase change layer 323, which may serve as a storage media 222 to store data bits, may be deposited on top of the top active Si layer 330. The top active Si layer 330, along with the phase change layer 323, may form a hetero junction p-n diode 370 for reading or writing data bits on the phase change layer 323 electrically. The hetero junction p-n diode 370 is typically formed when two different materials with different conductivity types, active Si and phase change material in this case, make junction and cause electric current flow in one direction. A capping layer 360 maybe coated over the phase change layer 323 to protect the phase change layer 323 and to prevent evaporation of material when heat is applied. The capping layer 360 may also modify the surface states of the phase change layer 323. The rotor wafer 220 may move in x and y direction to allow data bits to be written to or read from the storage media 222.

The device isolation process may enable the multiple hetero junction p-n diodes 370 to become electrically isolated from each other, so that each isolated diode 370 may be coupled with each field emitter tip 214. By moving the diodes 370 in the x and y direction, multiple data bits may be written in a single isolated diode 370, thus reducing chances of cross-talk between different diodes 370. With electronic signal interferences reduced, the signal to noise ratio may be greatly improved for the ARS system 200. Signal to noise ratio refers to the signal corresponding to reading the data bits.

FIGS. 4(a) to 4(f) illustrate an exemplary device isolation process flow for the ARS system 200. FIG. 4(a) illustrates ion implantation of oxygen beneath the top active Si layer 330(a) on the rotor wafer 220. After the implantation of oxygen, an insulating oxide layer 350(a) may be formed with heat treatment. The oxide layer 350(a) may electrically insulate the top active Si layer 330(a) and the rotor wafer 220, thereby preventing electron flowing between the top active Si layer 330(a) and the rotor wafer 220 body.

Referring to FIG. 4(b), the phase change layer 323(a) may be formed by depositing thin film of phase change material through thermal evaporation. The phase change materials are materials that can reversibly change phases from amorphous to crystalline. Amorphous materials typically have distorted atomic lattice and do not have a long range order. On the other hand, crystalline materials have a periodic array of atomic lattice with long range order. If crystalline materials are ion implanted, i.e., implanting energetic ions into the crystalline materials, the crystalline materials' lattice structure may be distorted by the implanted ions, and as a result, the crystalline materials may lose the long range order and become amorphous. The phase change layer 323(a) may record the data bits as a form of amorphous spots with crystalline background. Optionally, a protective capping layer 360 may be coated over the phase change layer 323(a) to protect the phase change layer surface and to prevent evaporation of material when heat is applied.

Referring to FIG. 4(c), a masking layer 410, such as a $SiO_2$ layer or a photoresist (PR) layer, may be deposited over the phase change layer 323(a). The masking layer 410 may be patterned using, for example, photolithography, and a predetermined portion of the masking layer 410 may be etched.

Referring to FIG. 4(d), the exposed portion of the phase change layer 323(a) corresponding to the removed portion of the masking layer 410 may be etched using either dry or wet processes. Dry etching is a directional and anisotrophic etching performed by plasma, i.e., mixture of discharged gas and electrons and neutral atoms. Accordingly, dry etching may be widely used to transfer fine patterns. Wet etching is performed by wet chemicals, such as acids and bases, and thus not very directional. Wet etching profile maybe isotrophic, and therefore, wet etching is not suitable to transfer fine patterns as small as sub-micron.

FIG. 4(e) illustrates the next step, etching the top active Si layer 330(a) until reaching the insulating oxide layer 350(a). Dry etching technique is typically used to define the top active Si layer 330(a) due to dry etching's better pattern transfer ability. As a result, the hetero junction p-n diodes 370, i.e., devices embedded in the top active Si layer 330(a) and the phase change layer 323(a), may become electrically isolated from one another to enhance signal to noise ratio for the ARS system 200.

Referring to FIG. 4(f), the masking layer 410 may be removed. Optionally, a protective capping layer 360 may be coated over the phase change layer 323(a) for protection.

FIGS. 5(a) to 5(c) illustrate another embodiment of the device isolation process flow for the ARS system 200.

Instead of ion implantation of oxygen through the rotor wafer 220, which is a highly doped Si substrate, to form an electrically insulating layer, counter dopant may be ion implanted to form a semi-insulating Si layer 350(b).

First, crystalline Si may be grown on a Si substrate using an epitaxial technique. The Types, i.e., n-type or p-type, of the Si may be controlled by adding dopant materials during the growth. The semi-insulating Si layer 350(b) maybe formed between the rotor wafer 220 and the top active Si layer 330(b) with an oppositely doped epitaxial Si layer. This technique, which forms are versed p-n junction diode, is referred to as "junction isolation."

Because epitaxial Si may be grown, for example, at 600° C. to 650° C., with a growth rate of, for example, 0.5 μm per minute, thermal budget of epitaxial growth step is not fatal to heat sensitive CMOS circuitry in the stator wafer 230. In addition, the doping concentration of the top active Si layer 330(b) may be independently optimized to the rotor wafer 220 for best device performance.

Referring to FIG. 5(a), a p-type doped Si may be epitaxially grown on an oppositely doped, i.e., n-type, Si rotor wafer 220 substrate. Activating the p-type Si dopant with heat treatment may form a p-type semi-insulating Si layer 350(b). Alternatively, a n-type doped Si may be epitaxially grown on a p-type Si rotor wafer 220 substrate to form a n-type semi-insulating Si layer.

Next, as shown in FIG. 5(b), an-type doped Si may be epitaxially grown on top of the p-type dopant. A n-type top active Si layer 330(b) maybe formed by activating the n-type Si dopant with heat treatment. Alternatively, a p-type doped Si may be grown on the n-type Si dopant to form a p-type top active Si layer.

Referring to FIG. 5(c), a p-type phase change layer 323(b) may be formed over the n-type top active Si layer 330(b) by depositing phase change materials. Alternatively, a n-type phase change layer may be formed over the p-type top active Si layer. Optionally, a protective capping layer 360 may be deposited over the phase change layer 323(b).

Similar to FIGS. 4(c) to 4(f) (not shown in FIG. 5), the masking layer 410, such as a hard masking SiO₂ layer or a soft masking photoresist (PR) layer, may be deposited over the phase change layer 323(b). The masking layer 410 may be patterned using, for example, photolithography, and a predetermined portion of the masking layer 410 may be etched. Then, the exposed potion of the phase change layer 323(b), corresponding to the removed portion of the masking layer 410, maybe etched using either dry or wet processes.

Next, the top active Si layer 330(b) maybe etched until reaching the semi-insulating Si layer 350(b). As a result, the hetero junction p-n diodes 370, i.e., devices embedded in the top active Si layer 330(b) and the phase change layer 323(b), may become electrically isolated from one another to enhance signal to noise ratio for the ARS system 200. Finally, the masking layer 410 may be removed and the protective capping layer 360 may optionally be coated over the phase change layer 323(b) and the top active Si layer 330(b) for protection.

Figure 6:
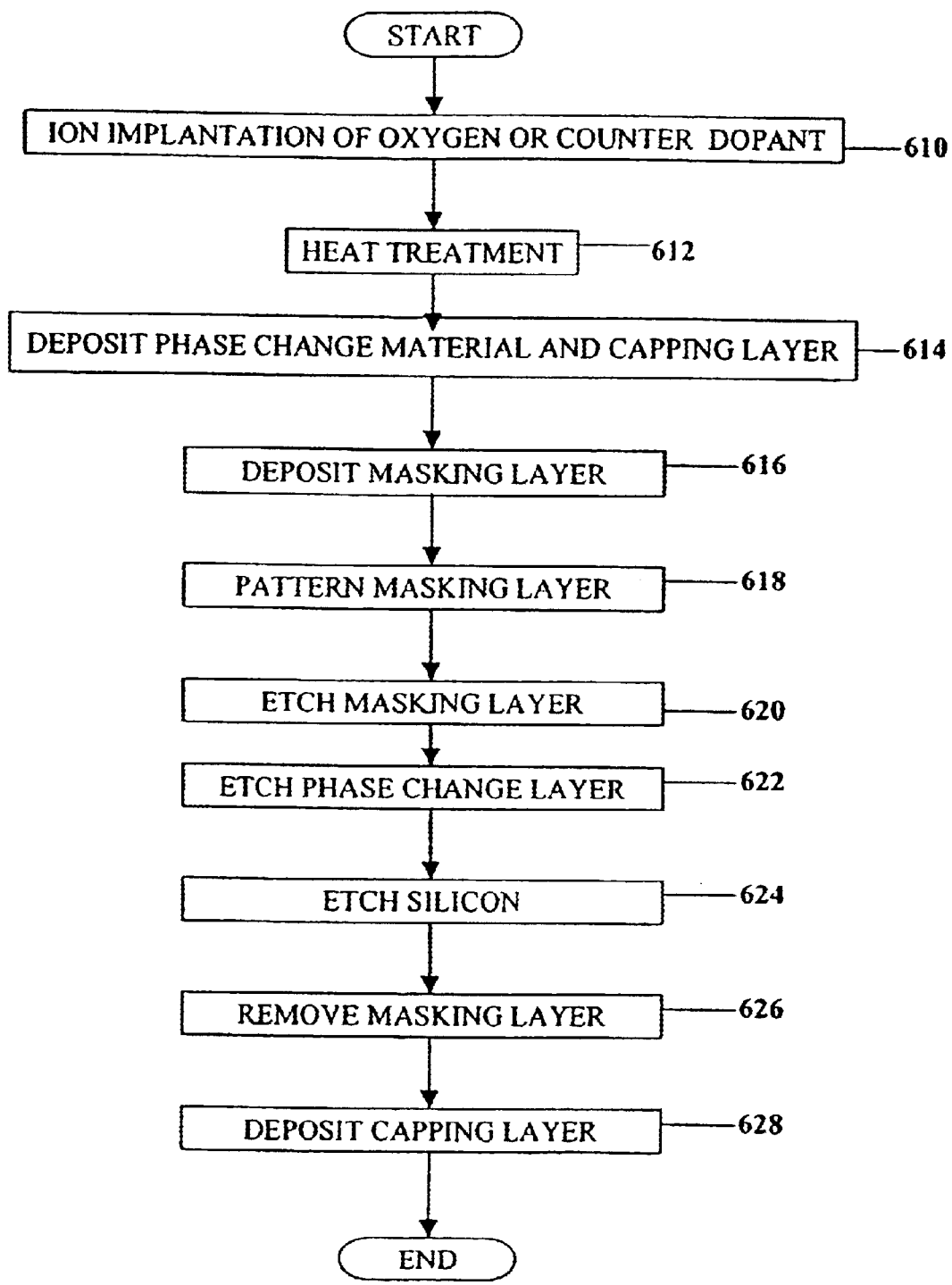
FIG. 6 is a flow chart illustrating an exemplary device isolation process flow for the ARS system.

FIG. 6 is a flow chart illustrating the device isolation process flow for the ARS system 100. Step 610 involves ion implantation of oxygen or counter dopant beneath the top active Si layer 330 on the rotor wafer substrate 220, followed by heat treatment to form an insulating layer 350 (step 612). Next, a phase change layer 323 may be formed by depositing phase change material over the top active Si layer 330 (step 614). Optionally, a protective capping layer 360 maybe coated over the phase change layer 323 for protection.

Next, a masking layer 410, such as hard masking SiO₂ layer or soft masking photoresist (PR) layer, may be deposited over the phase change layer 323 (step 616). The masking layer 410 may be patterned using photolithography (step 618) and a predetermined portion off the masking layer 410 may be etched (step 620). The exposed portion of the phase change layer 323 corresponding to the etched portion of the masking layer 410 may then be etched using either dry or wet processes (step 622). In step 624, the top active Si layer 330 maybe etched until reaching the insulating layer 350. Finally, the masking layer 410 may be removed (step 626) and optionally, a protective capping layer 360 may be deposited over the phase change layer 323 for protection (step 628).

While the device isolation process flow has been described in connection with an exemplary embodiment, it will be understood that many modifications in light of these teachings will be readily apparent to those skilled in the art, and this application is intended to cover any variations thereof.

What is claimed is:

1. An apparatus with isolated devices for an atomic resolution storage (ARS) system, comprising:
   a first wafer, wherein the first wafer includes field emitters that create electron beams by drawing electrons off a metal in the field emitters, and wherein the electron beams are used to write data bits onto storage media; and
   a second wafer, wherein the second wafer is a doped silicon (Si) substrate, the second wafer comprises:
   devices embedded in a top active Si layer, wherein the devices are isolated from one another, and each device is coupled with each field emitter; and
   an insulating layer positioned between the second wafer substrate and the top active Si layer, wherein the devices are isolated by etching of the top active Si layer until reaching the insulating layer in the second wafer.

2. The apparatus of claim 1, further comprising a phase change layer positioned above the top active Si layer.

3. The apparatus of claim 2, further comprising a protective capping layer over the phase change layer.

4. The apparatus of claim 1, wherein the field emitters are field emitter tips.

5. The apparatus of claim 1, wherein the field emitters are flat emitters.

6. The apparatus of claim 1, wherein the insulating layer is formed by heating oxygen that is ion implanted beneath the top active Si layer on the second wafer.

7. The apparatus of claim 1, wherein the insulating layer is formed by eating counter dopants that are epitaxially grown over the second wafer.

8. The apparatus of claim 1, wherein the second wafer is a rotor wafer.

\* \* \* \* \*